(12) United States Patent
Tanaka

(10) Patent No.: US 11,775,116 B2
(45) Date of Patent: Oct. 3, 2023

(54) INPUT DEVICE

(71) Applicant: Panasonic Intellectual Property Management Co., Ltd., Osaka (JP)

(72) Inventor: Tsuyoshi Tanaka, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/974,345

(22) Filed: Oct. 26, 2022

(65) Prior Publication Data

US 2023/0161440 A1 May 25, 2023

(30) Foreign Application Priority Data

Nov. 25, 2021 (JP) ................................. 2021-191309

(51) Int. Cl.
| | |
|---|---|
| *G06F 3/041* | (2006.01) |
| *G06F 3/044* | (2006.01) |
| *H04R 1/08* | (2006.01) |
| *H04R 1/02* | (2006.01) |
| *H04R 3/00* | (2006.01) |
| *B60N 2/75* | (2018.01) |
| *H03K 17/96* | (2006.01) |
| *B60N 3/00* | (2006.01) |

(52) U.S. Cl.
CPC ............ *G06F 3/0418* (2013.01); *G06F 3/044* (2013.01); *H04R 1/028* (2013.01); *H04R 1/08* (2013.01); *H04R 3/00* (2013.01); *B60N 2/793* (2018.02); *B60N 3/002* (2013.01); *G06F 2203/04104* (2013.01); *G06F 2203/04105* (2013.01); *H03K 17/962* (2013.01); *H04R 2499/15* (2013.01)

(58) Field of Classification Search
CPC .................. G06F 3/0418; G06F 3/044; G06F 2203/04104; G06F 2203/04105; H04R 1/028; H04R 1/08; H04R 3/00; H04R 2499/15; H03K 17/962; B60N 2/793; B60N 3/002

See application file for complete search history.

(56) References Cited

U.S. PATENT DOCUMENTS

| | | | |
|---|---|---|---|
| 10,963,101 B2 * | 3/2021 | Suto ........................ | G06F 3/048 |
| 2018/0118123 A1 | 5/2018 | Doi | |
| 2020/0117308 A1 * | 4/2020 | Heo ....................... | G06F 3/0416 |
| 2021/0011576 A1 * | 1/2021 | Suto ....................... | G06F 3/0414 |

FOREIGN PATENT DOCUMENTS

JP 2016203861 A 12/2016

* cited by examiner

*Primary Examiner* — Michael Pervan
(74) *Attorney, Agent, or Firm* — Seed IP Law Group LLP

(57) ABSTRACT

An input device is an input device provided for a table including a placement surface on which an object can be placed, and includes: a sensor that includes a touch sensor of a capacitive type for receiving a touch input on the placement surface; and a controller that determines, based on a detection result from the sensor, whether to enable or disable the touch input received by the touch sensor.

14 Claims, 5 Drawing Sheets

INPUT DEVICE

CROSS REFERENCE TO RELATED APPLICATION

The present application is based on and claims priority of Japanese Patent Application No. 2021-191309 filed on Nov. 25, 2021.

FIELD

The present disclosure relates to an input device.

BACKGROUND

There are known devices that receive user inputs (for example, see Patent Literature (PTL) 1).

An in-vehicle storage unit that can store items to be stored inside a vehicle is disclosed in PTL 1. The in-vehicle storage unit includes a storing portion that stores an item to be stored, an opening formed in the storing portion, a lid that is formed on the opening to be opened and closed, and a touch sensor panel that is formed in a surface of the lid to detect a touch operation by an operator.

CITATION LIST

Patent Literature

PTL 1: Japanese Unexamined Patent Application Publication No. 2016-203861

SUMMARY

However, the in-vehicle storage unit according to PTL 1 can be improved upon.

In view of this, the present disclosure provides an input device capable of improving upon the above related art.

An input device according to an aspect of the present disclosure is an input device provided for a table including a placement surface on which an object can be placed, and includes: a sensor that includes a touch sensor of a capacitive type for receiving a touch input on the placement surface; and a controller that determines, based on a detection result from the sensor, whether to enable or disable the touch input received by the touch sensor.

An input device according to one aspect of the present disclosure is capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

Figure 1:
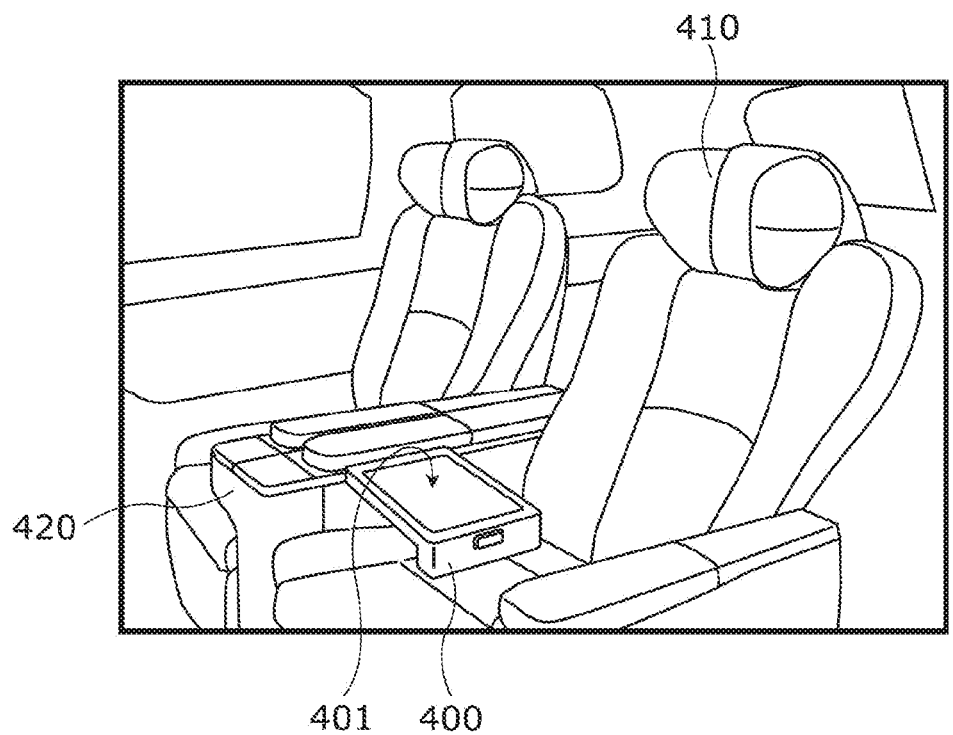
FIG. 1 illustrates a cabin of a vehicle in which a table provided with an input device according to an embodiment is disposed.

DESCRIPTION OF EMBODIMENTS (Overview of Present Disclosure)

Assume that a table on which objects can be placed and that is disposed adjacent to a seat inside a vehicle cabin is provided with a touch sensor that can detect touch inputs from a user. In this case, the user may place their arms, palms, or any other objects on the table. When the user's arm, for example, comes into contact with the touch sensor, a process based on the touch input unintended by the user may be executed.

An input device according to an aspect of the present disclosure is an input device provided for a table including a placement surface on which an object can be placed, and includes: a sensor that includes a touch sensor of a capacitive type for receiving a touch input on the placement surface; and a controller that determines, based on a detection result from the sensor, whether to enable or disable the touch input received by the touch sensor.

When the detection result from the sensor indicates that multiple touch inputs are received or that a very large load is detected, for example, it is conceivable that the touch inputs are unintended by the user. That is, it can be determined whether the touch inputs received by the touch sensor are intended or unintended by the user based on the detection result from the sensor. When it is conceivable that the touch inputs are unintended by the user, the touch inputs are disabled. This prevents processes based on touch inputs unintended by the user from being executed.

Furthermore, for example, the input device according an aspect of the present disclosure further includes: an actuator that vibrates the table. The sensor includes a microphone, and the controller determines whether a feature value related to sound produced by vibrating the table using the actuator and detected by the microphone satisfies a predetermined condition, and determines to disable the touch input when the predetermined condition is satisfied.

When an object, such as baggage of the user, is placed on the table, it is highly probable that the object causes a touch input unintended by the user. Accordingly, it is considered better to disable the touch input. Moreover, when an object, such as the baggage of the user, is placed on the table, the table may be affected when it vibrates, for example, the table may vibrate less, compared with a case where nothing is placed on the table. Accordingly, it is conceivable that the feature value, such as sound pressure (volume), frequency, or the like, of sound produced when the table vibrates differs when an object, such as the baggage of the user, is placed on the table and when nothing is placed on the table. To deal with this, it is determined whether an object is placed on the table by analyzing the feature value of the sound produced when the table is intentionally vibrated using the actuator. This appropriately prevents processes based on touch inputs unintended by the user from being executed.

Furthermore, for example, the controller determines whether a difference between a reference sound pressure and a sound pressure of sound produced by driving the actuator and detected by the microphone is greater than or equal to a predetermined sound pressure, and determines to disable the touch input when the difference is greater than or equal to the predetermined sound pressure.

According to this, the sound produced when the table is intentionally vibrated using the actuator can be easily analyzed. This easily and appropriately prevents processes based on touch inputs unintended by the user from being executed.

Furthermore, for example, the touch sensor includes a touch switch and a touch pad, and, while the touch switch and the touch pad are receiving touch inputs, the controller determines to (i) enable the touch input received by the touch pad when a position of the touch input received by the touch pad has kept changing for a predetermined time period or longer and (ii) disable the touch input received by the touch pad when the position of the touch input received by the touch pad does not keep changing for the predetermined time period or longer.

Furthermore, for example, when the touch pad receives a touch input while the touch switch is receiving a touch input, the controller determines to (i) enable the touch input received by the touch pad when the position of the touch input received by the touch pad has kept changing for the predetermined time period or longer and (ii) disable the touch input received by the touch pad when the position of the touch input received by the touch pad does not keep changing for the predetermined time period or longer.

When the user performs a touch input using the touch pad, for example, the user touches the touch pad with their fingers and moves their fingers along the surface of the touch pad to operate. For that reason, when an object comes into contact with the touch pad unintentionally, it is conceivable that the time of input to the touch pad during which the position of the touch input changes is usually short compared with a case where the user touches the touch pad intentionally. Accordingly, when both the touch switch and the touch pad have received touch inputs, the touch input received by the touch pad is disabled when the position of the touch input received by the touch pad does not keep changing for the predetermined time period or longer. This appropriately prevents a process based on the touch input unintended by the user from being executed.

Furthermore, for example, the touch sensor includes a plurality of touch switches, and, when at least two touch switches of the plurality of touch switches receive touch inputs, the controller determines to disable the touch inputs received by the at least two touch switches.

When the user places their palm, elbow, or the like on the table without the intention of touch inputs, it is highly probable that a plurality of touch sensors receive touch inputs. That is, when the at least two touch switches receive touch inputs, it is highly probable that the touch inputs are unintended by the user. Thus, processes based on touch inputs unintended by the user are easily and appropriately prevented from being executed.

Furthermore, for example, the touch sensor includes a touch pad, and, when the touch pad receives a touch input of which area is larger than or equal to a predetermined area, the controller determines to disable the touch input received by touch pad.

As described above, when the user performs a touch input using the touch pad, for example, the user touches the touch pad with their fingers and moves their fingers along the surface of the touch pad to operate. Accordingly, when the touch pad has received a touch input of which area is larger than a fingertip, for example, it is highly probable that the touch input is caused by, for example, baggage of the user when it is placed. Thus, according to the above, processes based on touch inputs unintended by the user are easily and appropriately prevented from being executed.

Furthermore, for example, the sensor includes a pressure sensor that detects a pressure applied to the placement surface, and, when the pressure detected by the pressure sensor is greater than or equal to a predetermined pressure, the controller determines to disable the touch input received by the touch sensor.

When the user performs a touch input, for example, the user touches the touch sensor with their fingers. Accordingly, when the user performs a touch input, it is conceivable that an extremely large pressure is not applied to the placement surface. On the other hand, when an object, such as the baggage of the user, is placed on the placement surface, a large pressure may be applied to a large placement surface compared with the case where the user touches the touch sensor. Thus, according to the above, processes based on touch inputs unintended by the user are easily and appropriately prevented from being executed by setting the predetermined pressure appropriately.

Furthermore, for example, the sensor includes a detector that detects whether the table is accommodated in an accommodation portion, and, upon detecting that the table is accommodated in the accommodation portion based on a detection result from the detector, the controller determines to disable the touch input received by the touch sensor.

It is conceivable that the user does not perform any touch inputs while the table is accommodated. Thus, according to the above, processes based on touch inputs unintended by the user are easily and appropriately prevented from being executed.

Furthermore, for example, the table is attached to an armrest of a chair included in a mobile unit.

As described above, the input device according to the present disclosure can prevent processes based on touch inputs unintended by the user from being executed. Accordingly, the input device is particularly effective when used for tables attached to armrests or the like and susceptible to touch inputs unintended by the user due to baggage or the arms of the user placed on the placement surface.

Furthermore, for example, the touch sensor includes a touch switch and a touch pad, and the touch switch is disposed closer to the chair than the touch pad is.

When the user seated in the chair, for example, attempts to perform touch inputs on the touch pad, such a layout of the touch sensor increases the probability of touch inputs unintended by the user on the touch switch. However, the touch sensor may need to be laid out in this manner due to the restrictions on, for example, the size of the table. As described above, the input device according to the present disclosure can prevent processes based on touch inputs unintended by the user from being executed. Accordingly, the input device is particularly effective when used for configurations including such touch sensor layouts susceptible to touch inputs unintended by the user.

Note that these generic or specific aspects may be implemented as a system, a method, an integrated circuit, a computer program, or a computer-readable recording medium such as a CD-ROM, or may be implemented as any combination of a system, a method, an integrated circuit, a computer program, and a recording medium.

Hereinafter, embodiments will be described in detail with reference to the drawings.

Note that each of the aspects described below shows a generic or specific example. The numerical values, shapes, materials, structural components, the arrangement and connection of the structural components, steps, the processing order of the steps, etc., shown in the following embodiments are merely examples, and thus are not intended to limit the present disclosure. Furthermore, among the structural components described in the following embodiments, structural components not recited in any one of the independent claims are described as optional structural components. Furthermore, the respective figures are schematic diagrams, and are not necessarily precise illustrations. Therefore, the scale, etc., in the respective figures do not necessarily match. Furthermore, in the figures, elements which are substantially the same are given the same reference signs.

Embodiment

[Configuration]

First, a configuration of an input device according to an exemplary embodiment will be described.

Figure 2:
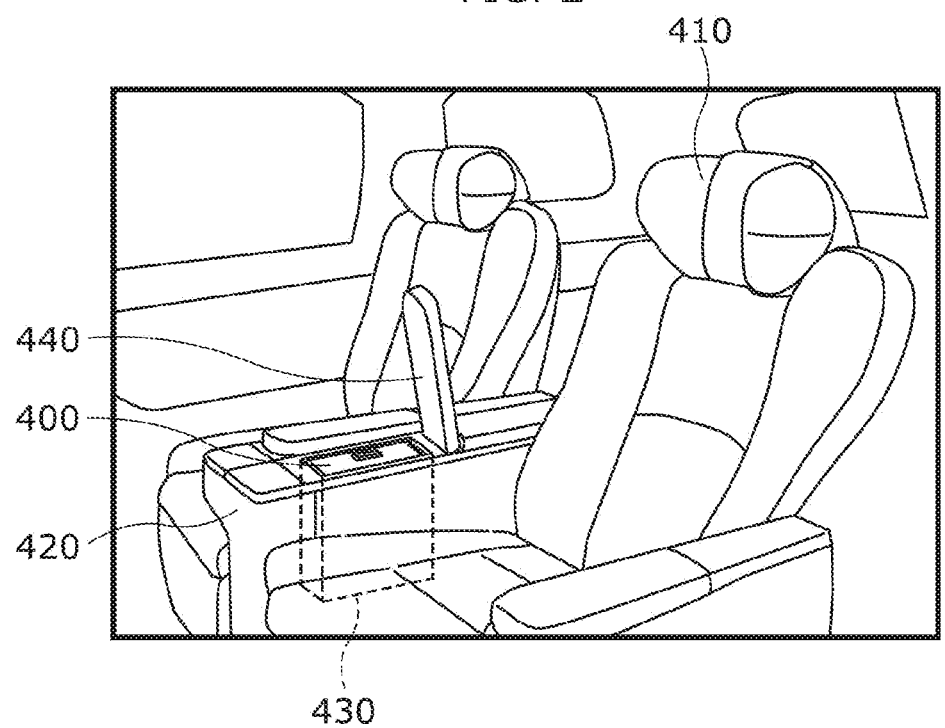
FIG. 2 illustrates the cabin of the vehicle in which the table provided with the input device according to the embodiment is disposed.
Figure 3:
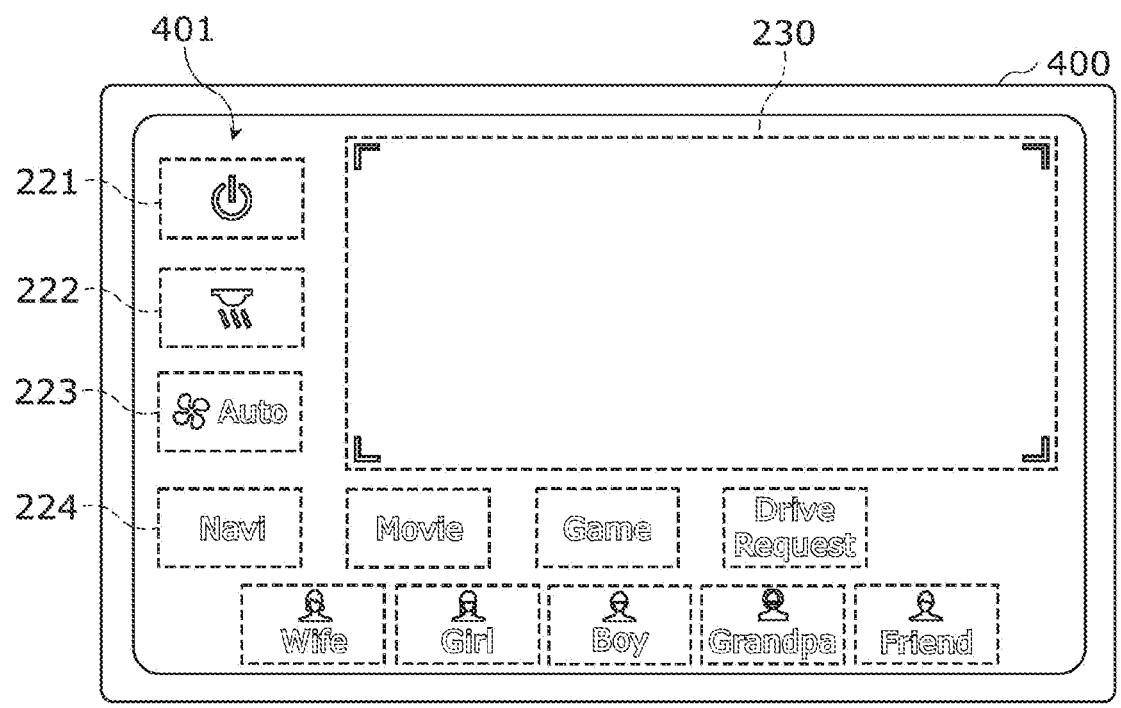
FIG. 3 is a plan view of the table according to the embodiment.

FIGS. 1 and 2 illustrate a cabin of a vehicle in which table 400 provided with the input device according to the embodiment is disposed. FIG. 3 is a plan view of table 400 according to the embodiment. Specifically, FIG. 1 illustrates table 400 in use by a user. FIG. 2 illustrates table 400 accommodated in accommodation portion 430 without being used by the user. FIG. 3 illustrates placement surface 401 of table 400.

The input device according to the embodiment is a user interface that receives user inputs. The input device according to the embodiment is provided for table 400 that includes placement surface 401 on which objects can be placed. Specifically, touch switches 221, 222, 223, and 224 and touch pad 230 included in the input device according to the embodiment are provided for table 400 to receive touch inputs (touch operations) on placement surface 401 from the user.

For example, touch switches 221, 222, 223, and 224 and touch pad 230 are embedded in table 400, and placement surface 401 is a design surface, such as a wood-grain surface.

For example, table 400 is not a touch panel display that displays images and includes a panel including a light source (not illustrated) and through-holes through which part of light emitted from the light source can pass to present specific marks. The light passing through the through-holes and a translucent design portion provided with the design surface presents marks such as a power button.

Note that the objects mentioned herein refer to those that can be placed on placement surface 401 of table 400. Examples include baggage or the arms of the user.

For example, table 400 is attached to armrest 420 of chair 410 included in a mobile unit. For example, table 400 is attached to armrest 420 using hinges or the like to be taken in and out of accommodation portion 430 in armrest 420. In this embodiment, a cushioned portion on which the user's arm can be placed and that is included in armrest 420 serves as cover 440 that can open and close an opening in accommodation portion 430.

For example, the mobile unit is a vehicle such as an automobile. The mobile unit in which input device 100 is disposed is not particularly limited and may be a train, a bullet train, or a plane. Moreover, table 400 may be used for the top of a dining table or a desk.

Figure 4:
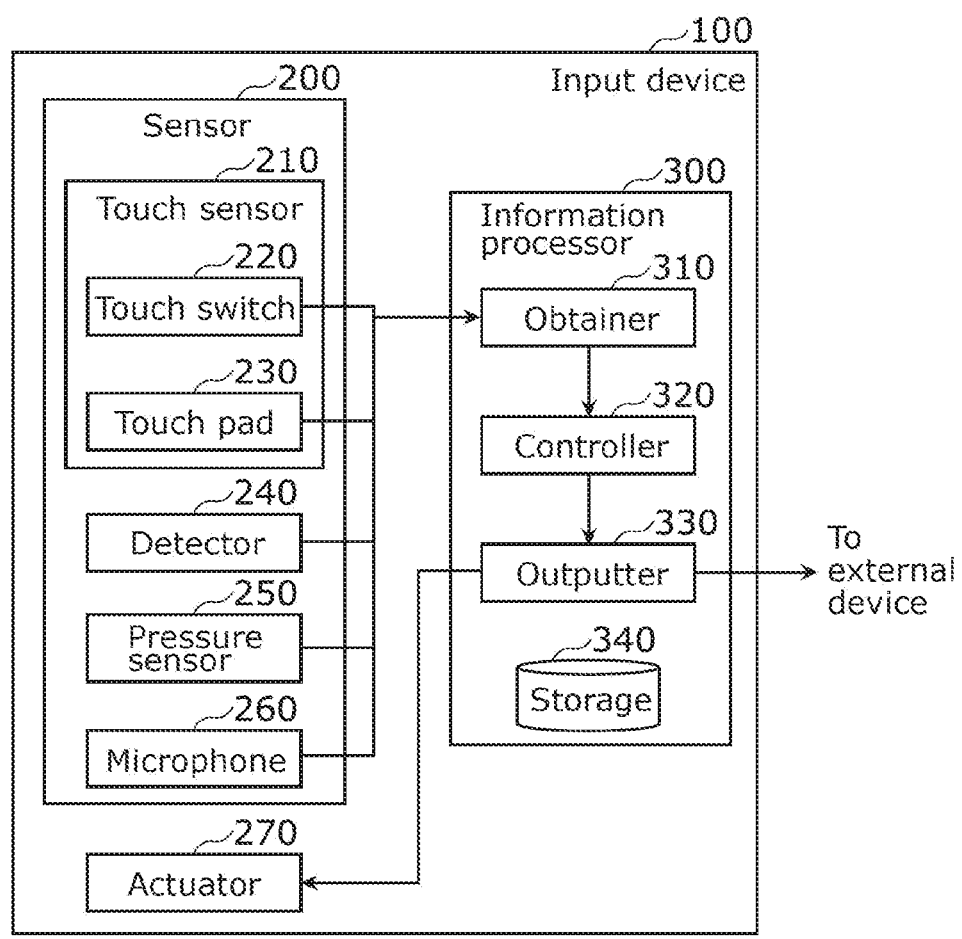
FIG. 4 is a block diagram illustrating a functional configuration of the input device according to the embodiment.

FIG. 4 is a block diagram illustrating a functional configuration of input device 100 according to the embodiment. Although input device 100 may include the plurality of touch switches 221 to 224 as illustrated in FIG. 3, single touch switch 220 is illustrated in FIG. 4.

Input device 100 is a controller that receives user inputs. Input device 100 includes sensor 200, actuator 270, and information processor 300.

Sensor 200 is a detection device for detecting various types of information such as whether touch inputs are provided. Specifically, sensor 200 includes, for example, capacitive touch sensor 210 that receives touch inputs on placement surface 401 and is formed of one or more sensors.

Sensor 200 includes touch sensor 210, detector 240, pressure sensor 250, and microphone 260.

Touch sensor 210 is a capacitive sensor that receives touch inputs on placement surface 401. Capacitive touch sensor 210 enables placement surface 401 to be flat compared with, for example, push buttons.

Touch sensor 210 includes one or more touch switches 220 and touch pad 230. The number of touch switches 220 is not particularly limited and may be one or more than one. In this embodiment, the number of touch switches 220 is 12 as illustrated in FIG. 3.

Touch switches 220 are capacitive sensors that receive touch inputs on placement surface 401. Specifically, touch switches 220 detect tapping. For example, touch switches 220 are implemented as touch switches 221 to 224 illustrated in FIG. 3.

Touch switch 221 is, for example, a power button. For example, the user performs a touch input (for example, touches with their finger) on touch switch 221 to use touch switches 222 to 224 and touch pad 230 provided for table 400.

Touch switch 222 is, for example, a light button. For example, the user performs a touch input on touch switch 222 to turn on and off the light source provided for the vehicle in which table 400 is disposed.

Touch switch 223 is, for example, an air conditioner button. For example, the user performs a touch input on touch switch 223 to turn on and off the air conditioner provided for the vehicle in which table 400 is disposed.

Touch switch 224 is, for example, a navigation button. For example, the user performs a touch input on touch switch 224 to toggle display of maps and other information obtained from a navigation system on and off in a display device, such as a display, provided for the vehicle in which table 400 is disposed.

Touch pad 230 is a capacitive sensor that receives touch inputs on placement surface 401. For example, the user performs touch inputs on touch pad 230 by swiping, pinching in, pinching out, and other finger movements along the surface of touch pad 230 to, for example, enlarge, shrink, and move the maps displayed in the display device. In this manner, touch pad 230 detects the positions at which the touch inputs are performed and changes in the positions. Moreover, for example, touch pad 230 detects the range (area) in which the touch inputs are performed.

For example, input device 100 sends information based on touch inputs received from the user by touch sensor 210 to external devices such as the display device or an electronic control unit (ECU) included in the vehicle, thereby causing the external devices to execute processes based on the touch inputs. The user can operate various devices disposed in the vehicle using input device 100 that operates as described above.

The layout of touch switches 220 and touch pad 230 is not particularly limited. In this embodiment, at least part of touch switches 220 is disposed closer to chair 410 than touch pad 230 is. Specifically, from the viewpoint of the user seated in chair 410, touch switches 220 are disposed closer to the user than touch pad 230 is.

Detector 240 is a sensor that detects whether table 400 (more specifically, touch sensor 210 including touch switches 220 and touch pad 230 provided for table 400) is accommodated in accommodation portion 430. For example, detector 240 is disposed inside accommodation portion 430 to detect whether table 400 is accommodated in accommodation portion 430. The type of detector 240 is not particularly limited and may be, for example, a photodetector or an ultrasound sensor.

Pressure sensor 250 is a sensor that detects pressure (load) applied to placement surface 401. For example, pressure sensor 250 is disposed on table 400 to detect pressure applied to placement surface 401.

Microphone 260 is a sensor that detects sound. Specifically, microphone 260 detects sound produced by vibrating table 400 using actuator 270. For example, microphone 260 detects sound pressure caused by vibrating table 400 using actuator 270.

Microphone 260 may be disposed at any position on table 400, chair 410, or the like where microphone 260 can detect sound produced by vibrating table 400 using actuator 270.

Actuator 270 is a drive device that vibrates table 400. For example, actuator 270 is implemented as a motor or the like disposed on table 400 or on a hinge that connects table 400 and armrest 420.

Information processor 300 is a processing device that processes various types of information in input device 100. For example, information processor 300 is implemented as a computer including an interface that is connected to sensor 200 and control lines connected to the external devices, nonvolatile memory that stores programs, volatile memory serving as a temporary storage area for executing programs, and a processor that executes programs.

Information processor 300 includes obtainer 310, controller 320, and outputter 330.

Obtainer 310 obtains various types of information detected by sensor 200. For example, obtainer 310 is a communication interface for communicating with sensor 200. Obtainer 310 may be implemented as, for example, a connector connected to the control lines or may be implemented as, for example, a wireless communication circuit that enables wireless communication with sensor 200.

Controller 320 is a processor that processes various types of information in input device 100. For example, controller 320 executes processes based on touch inputs received by touch sensor 210. For example, when touch switch 222 has received a touch input, controller 320 instructs the corresponding external device to turn on the light source disposed in the vehicle. Specifically, when touch switch 222 has received a touch input, controller 320 outputs information indicating the instruction to turn on the light source disposed in the vehicle to the external device through outputter 330.

Here, for example, assume that table 400 disposed adjacent to a seat inside the vehicle cabin is provided with touch sensor 210. In this case, the user may place their arms, palms, or any other objects on table 400. When the user's arm, for example, comes into contact with touch sensor 210, a process based on the touch input unintended by the user may be executed.

To prevent this, controller 320 determines whether to enable or disable the touch input received by touch sensor 210 based on detection results from sensor 200. For example, controller 320 executes a process based on the touch input received by touch sensor 210 when the touch input is determined to be enabled, whereas controller 320 does not execute the process based on the touch input received by touch sensor 210 when the touch input is determined to be disabled. For example, when a touch input is received by touch switch 222 and determined to be enabled, controller 320 outputs the information indicating the instruction to turn on the light source disposed in the vehicle to the corresponding external device through outputter 330. When a touch input is received by touch switch 222 and determined to be disabled, controller 320 does not output the information indicating the instruction to turn on the light source disposed in the vehicle to the external device through outputter 330.

When the detection results from sensor 200 indicate that multiple touch inputs are received or that a very large load is detected, for example, it is conceivable that the touch inputs are unintended by the user. That is, it can be determined whether the touch inputs received by touch sensor 210 are intended or unintended by the user based on the detection results from sensor 200. When it is conceivable that the touch inputs are unintended by the user, the touch inputs are disabled. This prevents processes based on touch inputs unintended by the user from being executed.

For example, controller 320 determines whether a feature value related to sound produced by vibrating table 400 using actuator 270 and detected by microphone 260 satisfies a predetermined condition. When the feature value satisfies the predetermined condition, controller 320 determines to disable the touch input, whereas when the feature value does not satisfy the predetermined condition, controller 320 determines to enable the touch input.

The feature value may be set freely. For example, the feature value is the frequency, waveform, or sound pressure of the sound detected by microphone 260. Specifically, for example, controller 320 determines whether the difference between a reference sound pressure and the sound pressure of sound produced by driving actuator 270 and detected by microphone 260 is greater than or equal to a predetermined sound pressure. When the difference is greater than or equal to the predetermined sound pressure, controller 320 determines to disable the touch input, whereas when the difference is less than the predetermined sound pressure, controller 320 determines to enable the touch input.

When an object, such as baggage of the user, is placed on table 400, it is highly probable that the object causes a touch input unintended by the user. Accordingly, it is considered better to disable the touch input. Moreover, when a heavy object, such as the baggage of the user, is placed on table 400, table 400 may be affected when it vibrates, for example, table 400 may vibrate less, compared with a case where nothing is placed on table 400. Alternatively, for example, when a light object, such as an empty can, is placed on table 400, vibration of the object may cause an increase in sound pressure detected by microphone 260 compared with the case where nothing is placed on table 400. Accordingly, it is conceivable that the feature value, such as sound pressure, frequency, or the like, of sound produced when table 400 vibrates differs when an object, such as the baggage of the user, is placed on table 400 and when nothing is placed on table 400. To deal with this, it is determined whether an object is placed on table 400 by analyzing the feature value of the sound produced when table 400 is intentionally vibrated using actuator 270. This appropriately prevents processes based on touch inputs unintended by the user from being executed.

Information indicating the reference sound pressure and information indicating the predetermined sound pressure that serve as thresholds may be stored in storage 340 in advance. Note that the reference sound pressure may be, for example, the sound pressure of sound produced by driving actuator 270 with no object placed on table 400 and detected by microphone 260.

Moreover, for example, while touch switches 220 and touch pad 230 are receiving touch inputs, controller 320 determines to (i) enable the touch input received by touch pad 230 when the position of the touch input received by touch pad 230 has kept changing for a predetermined time period or longer and (ii) disable the touch input received by touch pad 230 when the position of the touch input received by touch pad 230 does not keep changing for the predetermined time period or longer.

Moreover, for example, when touch pad 230 has received a touch input while touch switches 220 are receiving touch inputs, controller 320 determines to (i) enable the touch input received by touch pad 230 when the position of the touch input received by touch pad 230 has kept changing for the predetermined time period or longer and (ii) disable the touch input received by touch pad 230 when the position of the touch input received by touch pad 230 does not keep changing for the predetermined time period or longer.

When an object comes into contact with touch pad 230 unintentionally, it is conceivable that the time of input to touch pad 230 during which the position of the touch input changes is usually short compared with a case where the user touches touch pad 230 intentionally. Accordingly, when the position of the touch input received by touch pad 230 does not keep changing for the predetermined time period or longer, the touch input received by touch pad 230 is disabled. This appropriately prevents a process based on the touch input unintended by the user from being executed.

Note that, in the case of (i) above, the touch inputs received by touch switches 220 may be determined to be enabled or may be determined to be disabled.

Moreover, for example, when touch switches 220 have received touch inputs while touch pad 230 is receiving a touch input, controller 320 determines to disable the touch inputs received by touch switches 220 and touch pad 230. For example, when touch switches 220 have received no touch inputs for a predetermined duration while touch pad 230 is receiving a touch input, controller 320 determines to enable the touch input received by touch pad 230 during the predetermined duration.

Note that the state where touch pad 230 is receiving a touch input is a state where touch pad 230 keeps receiving a touch input, that is, an object, such as the user's finger, is kept in contact with touch pad 230.

Moreover, for example, when at least two touch switches 220 of the plurality of touch switches 220 (for example, touch switches 221 to 224) have received touch inputs, controller 320 determines to disable the touch inputs received by the at least two touch switches 220. That is, for example, when single touch switch 220 of the plurality of touch switches 220 has received a touch input, controller 320 determines to enable the touch input received by single touch switch 220.

The case where at least two touch switches 220 have received touch inputs refers to a case where, for example, at least two touch switches 220 have received touch inputs at the same time, that is, not only a case where the receptions completely coincide but a case where one of touch switches 220 has received a touch input while another touch switch 220 is receiving a touch input. For example, the case where at least two touch switches 220 have received touch inputs may be a case where the user's finger and wrist touch table 400 in this order or a case where their wrist and finger touch table 400 in this order, that is, a case where touch pad 230 and touch switches 220 receive touch inputs in this order or a case where touch switches 220 and touch pad 230 receive touch inputs in this order.

Moreover, for example, when touch pad 230 has received a touch input of which area is larger than or equal to a predetermined area, controller 320 determines to disable the touch input received by touch pad 230, whereas when touch pad 230 has received a touch input of which area is less than the predetermined area, controller 320 determines to enable the touch input received by touch pad 230.

For example, when touch pad 230 has received a touch input of which area is larger than a fingertip, it is highly probable that the touch input is caused by, for example, baggage of the user when it is placed. Thus, according to the above, processes based on touch inputs unintended by the user are easily and appropriately prevented from being executed.

Note that the area used by controller 320 for determination is, for example, the area of a part receiving a touch input spatially continuously (that is, a touch input on one spot).

Moreover, for example, when the pressure detected by pressure sensor 250 is greater than or equal to a predetermined pressure, controller 320 determines to disable the touch input received by touch sensor 210, whereas when the pressure detected by pressure sensor 250 is less than the predetermined pressure, controller 320 determines to enable the touch input received by touch sensor 210.

When an object, such as baggage of the user, is placed on placement surface 401, a large pressure may be applied to a large placement surface compared with the case where the user touches touch sensor 210. Thus, according to the above, processes based on touch inputs unintended by the user are easily and appropriately prevented from being executed by setting the predetermined pressure appropriately.

Moreover, for example, upon determining that table 400 is accommodated in accommodation portion 430 based on detection results from detector 240, controller 320 determines to disable the touch input received by touch sensor 210. That is, for example, upon determining that table 400 is in a state illustrated in FIG. 2, controller 320 determines to disable the touch input received by touch sensor 210. On the other hand, for example, when detector 240 detects that table 400 is not accommodated in accommodation portion 430, controller 320 determines to enable the touch input received by touch sensor 210. That is, for example, upon determining that table 400 is in a state illustrated in FIG. 1, controller 320 determines to enable the touch input received by touch sensor 210.

It is conceivable that the user does not perform any touch inputs while table 400 is accommodated. Thus, according to the above, processes based on touch inputs unintended by the user are easily and appropriately prevented from being executed.

Note that information indicating the predetermined condition, the predetermined sound pressure, the predetermined time period, the predetermined duration, the predetermined area, and the predetermined pressure is not particularly limited and may be set freely in advance. The information may be stored in storage 340 in advance.

Moreover, the expressions including "greater (larger) than or equal to" and "less than" described above are used to compare values above and below the thresholds, and may be replaced with expressions including "greater (larger) than" and "less than or equal to", respectively.

Moreover, controller 320 may include a timer such as a real time clock (RTC).

Moreover, one or more methods for determination used by controller 320 may be freely combined.

Outputter 330 outputs, for example, information indicating instructions to the external devices and information indicating an instruction to drive actuator 270. For example, controller 320 controls the driving of actuator 270 through outputter 330 and outputs information based on touch inputs to the external devices.

For example, outputter 330 is a communication interface for communicating with the external devices and actuator 270. Outputter 330 may be implemented as, for example, a connector connected to the control lines or may be implemented as, for example, a wireless communication circuit that enables wireless communication with the external devices and actuator 270.

Note that obtainer 310 and outputter 330 may be implemented as, for example, a common communication interface.

Storage 340 is a storage device that stores control programs executed by processors (for example, controller 320) included in input device 100 and condition information indicating the predetermined condition and conditions such as the thresholds of the predetermined sound pressure and the like. For example, storage 340 is implemented as flash memory or a hard disk drive (HDD).

[Processing Procedure]

The processing procedure performed by input device 100 will now be described.

Figure 5:
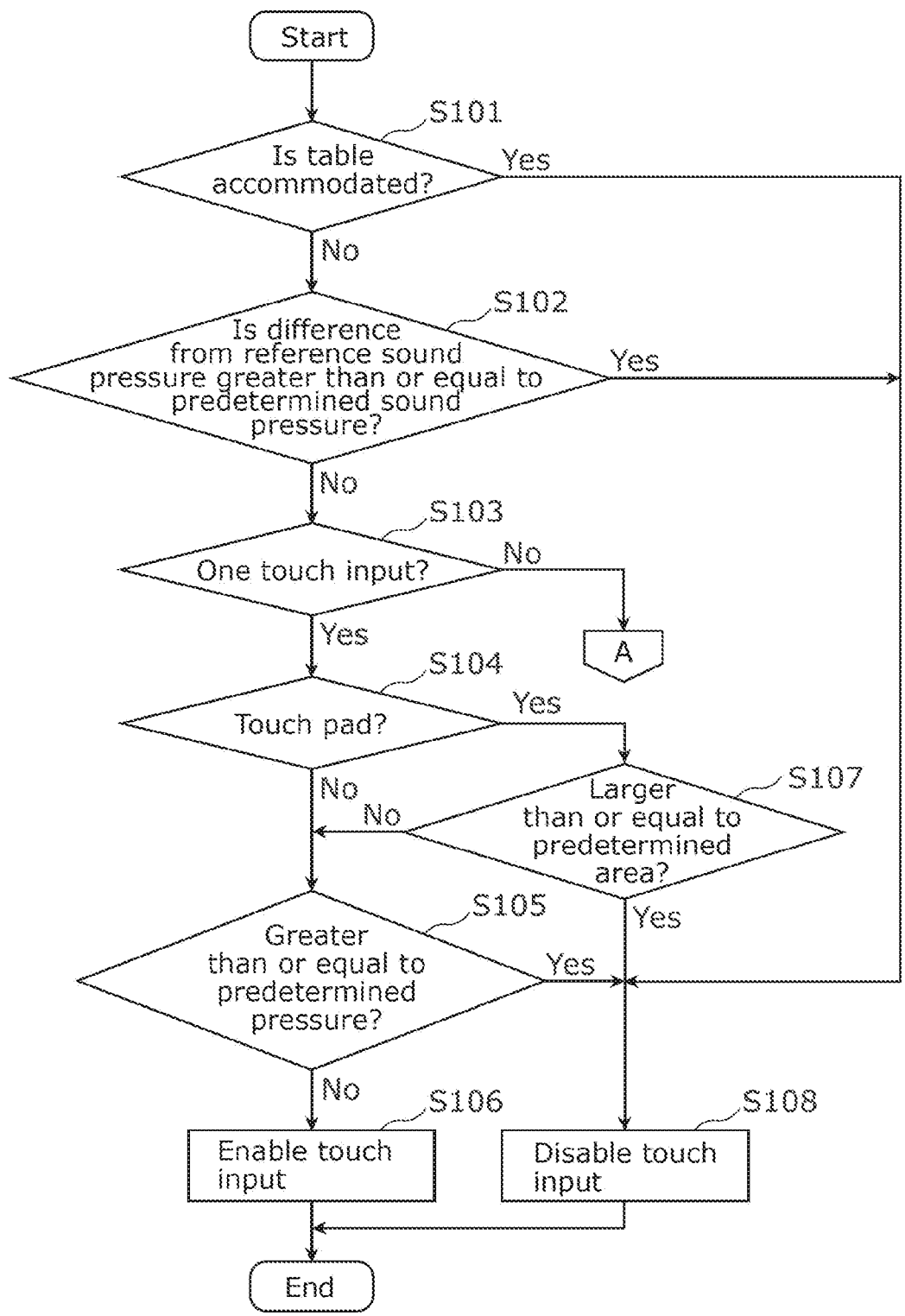
FIG. 5 is a flowchart illustrating a processing procedure performed by the input device according to the embodiment.
Figure 6:
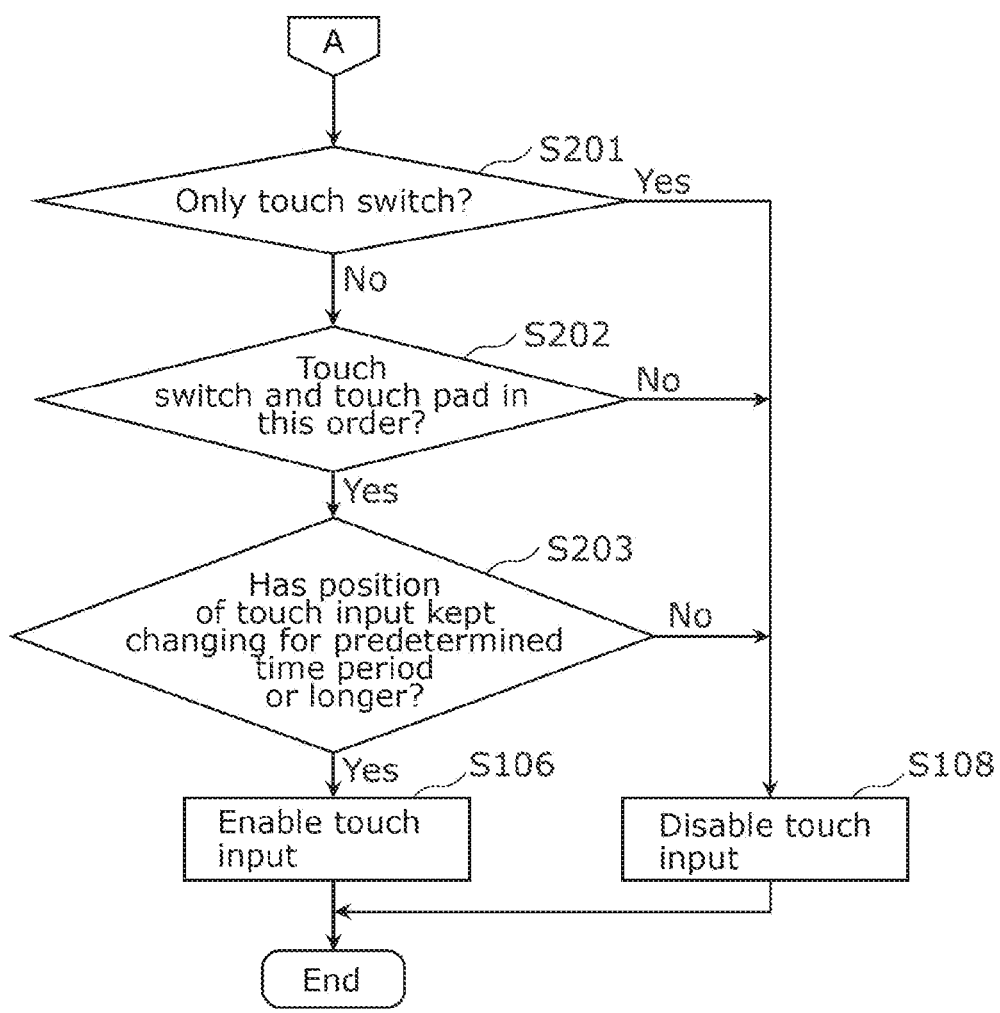
FIG. 6 is a flowchart illustrating the processing procedure performed by the input device according to the embodiment.

FIGS. 5 and 6 are flowcharts illustrating the processing procedure performed by input device 100 according to the embodiment.

First, sensor 200 starts detecting various types of information. Obtainer 310 obtains various types of information detected by sensor 200 from sensor 200. Here, assume that touch sensor 210 has received at least one touch input. Controller 320 then determines whether to enable or disable the touch input.

As illustrated in FIG. 5, controller 320 determines whether table 400 is accommodated in accommodation portion 430 based on the detection results from detector 240 (S101).

Upon determining that table 400 is accommodated in accommodation portion 430 (Yes in S101), controller 320 determines to disable the touch input (S108). In this case, controller 320 ends the process without executing a process based on the touch input.

Upon determining that table 400 is not accommodated in accommodation portion 430 (No in S101), controller 320 drives actuator 270 to vibrate table 400 and determines whether the difference between the reference sound pressure and the sound pressure of sound produced by driving actuator 270 and detected by microphone 260 is greater than or equal to the predetermined sound pressure (S102).

Upon determining that the difference is greater than or equal to the predetermined sound pressure (Yes in S102), controller 320 determines to disable the touch input (S108).

Upon determining that the difference is less than the predetermined sound pressure (No in S102), controller 320 determines whether touch sensor 210 has received one touch input (S103). That is, controller 320 determines whether the number of the at least one touch input received by touch sensor 210 is one or more than one. Here, the total number of touch inputs received by touch switches 220 and touch pad 230 is determined. Note that the total number of touch inputs here indicates the total number of sensors that have received touch inputs. For example, when touch pad 230 has received touch inputs on multiple spots, it is determined that the number of touch inputs performed on touch pad 230 is one.

Upon determining that touch sensor 210 has received one touch input (Yes in S103), controller 320 determines whether touch pad 230 has received the touch input (S104). That is, controller 320 determines whether the touch input is received by touch pad 230 or touch switch 220.

Upon determining that touch pad 230 has received the touch input (Yes in S104), controller 320 determines whether the area of the touch input is larger than or equal to the predetermined area (S107).

Upon determining that the area is larger than or equal to the predetermined area (Yes in S107), controller 320 determines to disable the touch input (S108).

Upon determining that touch switch 220 has received the touch input (No in S104) or that the area of the touch input is less than the predetermined area (No in S107), controller 320 determines whether the pressure detected by pressure sensor 250 is greater than or equal to the predetermined pressure (S105).

Upon determining that the pressure is greater than or equal to the predetermined pressure (Yes in S105), controller 320 determines to disable the touch input (S108).

Upon determining that pressure is less than the predetermined pressure (No in S105), controller 320 determines to enable the touch input (S106). That is, in this case, controller 320 executes a process based on the touch input.

Moreover, upon determining that the number of touch inputs received by touch sensor 210 is more than one (No in S103), controller 320 determines whether the multiple touch inputs are received only by touch switches 220 as illustrated in FIG. 6 (S201). That is, controller 320 determines whether touch pad 230 is included in the sensors that have received the touch inputs.

Upon determining that multiple touch inputs are received only by touch switches 220 (Yes in S201), controller 320 determines to disable the touch inputs (S108).

Upon determining that multiple touch inputs are not received only by touch switches 220 (No in S201), that is, upon determining that both touch switch 220 and touch pad 230 have received the touch inputs, controller 320 determines whether the touch inputs are performed on touch switch 220 and touch pad 230 in this order (S202). That is, controller 320 determines whether the touch input received by touch switch 220 precedes the touch input received by touch pad 230.

Upon determining that the touch inputs are not performed on touch switch 220 and touch pad 230 in this order (No in S202), that is, upon determining that the touch inputs are performed on touch pad 230 and touch switch 220 in this order, controller 320 determines to disable the touch inputs (S108).

Upon determining that the touch inputs are performed on touch switch 220 and touch pad 230 in this order (Yes in S202), controller 320 determines whether the position of the touch input received by touch pad 230 has kept changing for the predetermined time period or longer (S203).

Upon determining that the position has kept changing for the predetermined time period or longer (Yes in S203), controller 320 determines to enable the touch input (S108).

In this case, controller 320 may determine to enable the touch input received by touch pad 230 while determining to disable the touch input received by touch switch 220, or may determine to enable both touch inputs.

Upon determining that the position does not keep changing for the predetermined time period or longer (No in S203), controller 320 determines to disable the touch inputs (S108).

Advantageous Effects

As described above, input device 100 according to the embodiment is an input device provided for table 400 that includes placement surface 401 on which objects can be placed. Input device 100 includes sensor 200 including capacitive touch sensor 210 that receives touch inputs on placement surface 401 and controller 320 that determines whether to enable or disable the touch inputs received by touch sensor 210 based on the detection results from sensor 200.

For example, input device 100 is a controller used for table 400 integral to interior decoration and has the function of enabling or disabling the touch inputs. For example, when touch sensor 210 that can detect touch inputs from a user is provided for table 400 on which objects can be placed and that is disposed adjacent to a seat (chair 410) inside a vehicle cabin, the user may place their arms, palms, or any other objects on table 400 with no intention of operations. Accordingly, determining whether the user has performed the touch inputs with or without the intention of operations is desired. To achieve this, input device 100 includes touch pad 230 and the plurality of operable touch switches 220 displayed by allowing passage of light without impairing the interior decoration. Furthermore, controller 320 determines whether the touch inputs are unintended as described above based on signals from sensor 200 including signals from touch sensor 210, a signal from microphone 260, a signal from detector 240, and a signal from pressure sensor 250 (that is, the detection results from sensor 200). This prevents processes based on touch inputs unintended by the user from being executed.

Moreover, table 400 is attached to armrest 420 of chair 410 included in the mobile unit, and touch switches 220 are disposed closer to chair 410 than touch pad 230 is. For example, at least one of the plurality of touch switches 220 is disposed closer to chair 410 than touch pad 230 is. Furthermore, when touch pad 230 has received a touch input while touch switches 220 are receiving touch inputs, controller 320 enables the touch input received by touch pad 230 when the position of the touch input received by touch pad 230 has kept changing for the predetermined time period or longer. Additionally, in this case, for example, controller 320 disables the touch inputs received by touch switches 220.

For example, while the user seated in chair 410 performs a touch input on touch pad 230 using their fingertip with their wrist resting on table 400, their wrist may come into contact with touch switches 220 located adjacent to the user. However, according to the above, controller 320 can perform only the process based on the touch input intended by the user and can prevent processes based on the touch inputs unintended by the user. This can improve the usability for users.

Note that comprehensive or specific aspects of input device 100 described above may be implemented as systems, methods, integrated circuits, computer programs, or non-transitory computer-readable recording medium such as CD-ROMs or may be implemented as any desired combinations of systems, methods, integrated circuits, computer programs or non-transitory recording medium.

For example, an input method according to one aspect of the present disclosure is an input method implemented by input device 100 provided for table 400 that includes placement surface 401 on which objects can be placed. The input method includes determining whether to enable or disable touch inputs received by touch sensor 210 based on detection results from sensor 200 including capacitive touch sensor 210 that receives the touch inputs on placement surface 401.

Moreover, for example, a program according to one aspect of the present disclosure is a program that causes a computer to execute the above-described input method.

These also produce effects similar to those produce by input device 100.

OTHER EMBODIMENTS

Although an input device and the like according to one or more aspects have been described above based on the foregoing embodiments, these embodiments are not intended to limit the present disclosure. The scope of the present disclosure encompasses forms obtained by various modifications, to the foregoing embodiments, that can be conceived by those skilled in the art without departing from the spirit of the present disclosure.

For example, in the foregoing embodiment, accommodation portion 430 is a case, and a table is disposed in the case. However, for example, accommodation portion 430 may be a fastener for placing table 400 vertically along armrest 420 (for example, such that placement surface 401 is parallel to the side face of armrest 420). For example, the state where table 400 is secured by the fastener may be the state where table 400 is accommodated.

Moreover, for example, in the above embodiments, the respective structural components of the processing units included in input device 100 may be implemented as dedicated hardware or may be realized by executing a software program suited to the respective structural components. Alternatively, the respective structural components may be implemented by a program executor such as a CPU or a processor reading out and executing the software program recorded on a recording medium such as a hard disk or a semiconductor memory.

Furthermore, the processing units of input device 100 may be implemented as a single processor together with an ECU, etc.

It should be noted that the present disclosure includes cases such as these described below.

(1) At least one of the foregoing devices is, specifically, a computer system configured with a microprocessor, a ROM (Read Only Memory), a RAM (Random Access Memory), a hard disk unit, a display unit, a keyboard, a mouse, etc. The RAM or hard disk unit stores a computer program. The microprocessor operates according to the computer program so that a function of the aforementioned at least one device is achieved. Here, a computer program is configured by combining a plurality of command codes indicating commands for a computer in order to achieve a particular function.

(2) Some or all of the structural components included in the at least one device above may be realized as a single system large scale integration (LSI). The system LSI is a super multifunctional LSI manufactured by integrating a plurality of structural units onto a single chip. To be more specific, the system LSI is a computer system configured with a microprocessor, a ROM, a RAM, and so on. The RAM stores a computer program. The microprocessor operates according to the computer program so that a function of the system LSI is achieved.

(3) Some or all of the structural components included in the at least one device above may be implemented as an IC card or a standalone module that can be inserted into and removed from the device. The IC card or the module is a computer system configured with a microprocessor, a ROM, a RAM, and so on. The IC card or the module may include the aforementioned super multifunctional LSI. The microprocessor operates according to the computer program, so that a function of the IC card or the module is achieved. The IC card or the module may be tamper-resistant.

(4) The present disclosure may be the methods described above. Furthermore, the present disclosure may be a computer program for causing a computer to execute these methods. Moreover, the present disclosure may be a digital signal of the computer program.

Moreover, the present disclosure may be the aforementioned computer program or digital signal recorded on a computer-readable recording medium, such as a flexible disk, a hard disk, a CD (compact disc)-ROM, a DVD, a DVD-ROM, a DVD-RAM, a Blu-ray (registered trademark) disc (BD), or a semiconductor memory. Furthermore, the present disclosure may also be the digital signal recorded on these recording mediums.

Furthermore, the present disclosure may be the aforementioned computer program or digital signal transmitted via a telecommunication line, a wireless or wired communication line, a network represented by the Internet, data broadcasting, and so on.

Furthermore, by transferring the recording medium having the aforementioned program or digital signal recorded thereon or by transferring the aforementioned program or digital signal via the aforementioned network or the like, the present disclosure may be implemented by a different independent computer system.

Further Information about Technical Background to this Application

The disclosure of the following patent application including specification, drawings, and claims are incorporated herein by reference in their entirety: Japanese Patent Application No. 2021-191309 filed on Nov. 25, 2021.

INDUSTRIAL APPLICABILITY

The present disclosure can be used for, for example, input devices provided for tables disposed on chairs included in vehicles.

The invention claimed is:

1. An input device provided for a table including a placement surface on which an object can be placed, the input device comprising:
a sensor that includes a touch sensor of a capacitive type for receiving a touch input on the placement surface; and
a controller that determines, based on a detection result from the sensor, whether to enable or disable the touch input received by the touch sensor, wherein:
the touch sensor includes a touch switch and a touch pad, and
while the touch switch and the touch pad are receiving touch inputs, the controller determines to (i) enable the touch input received by the touch pad when a position of the touch input received by the touch pad has kept changing for a predetermined time period or longer and (ii) disable the touch input received by the touch pad when the position of the touch input received by the touch pad does not keep changing for the predetermined time period or longer.

2. The input device according to claim 1, further comprising:
an actuator that vibrates the table, wherein
the sensor includes a microphone, and
the controller determines whether a feature value related to sound produced by vibrating the table using the actuator and detected by the microphone satisfies a predetermined condition, and determines to disable the touch input when the predetermined condition is satisfied.

3. The input device according to claim 2, wherein
the controller determines whether a difference between a reference sound pressure and a sound pressure of sound produced by driving the actuator and detected by the microphone is greater than or equal to a predetermined sound pressure, and determines to disable the touch input when the difference is greater than or equal to the predetermined sound pressure.

4. The input device according to claim 1, wherein
when the touch pad receives a touch input while the touch switch is receiving a touch input, the controller determines to (i) enable the touch input received by the touch pad when the position of the touch input received by the touch pad has kept changing for the predetermined time period or longer and (ii) disable the touch input received by the touch pad when the position of the touch input received by the touch pad does not keep changing for the predetermined time period or longer.

5. The input device according to claim 4, wherein
the table is attached to an armrest of a chair included in a mobile unit, and
the touch switch is disposed closer to the chair than the touch pad.

6. The input device according to claim 1, wherein
the touch sensor has a plurality of touch switches including the touch switch, and
when at least two touch switches of the plurality of touch switches receive touch inputs, the controller determines to disable the touch inputs received by the at least two touch switches.

7. The input device according to claim 1, wherein
when the touch pad receives a touch input of which area is larger than or equal to a predetermined area, the controller determines to disable the touch input received by touch pad.

8. The input device according to claim 1, wherein
the sensor includes a pressure sensor that detects a pressure applied to the placement surface, and
when the pressure detected by the pressure sensor is greater than or equal to a predetermined pressure, the controller determines to disable the touch input received by the touch sensor.

9. The input device according to claim 1, wherein
the sensor includes a detector that detects whether the table is accommodated in an accommodation portion, and
upon detecting that the table is accommodated in the accommodation portion based on a detection result from the detector, the controller determines to disable the touch input received by the touch sensor.

10. The input device according to claim 1, wherein
the table is attached to an armrest of a chair included in a mobile unit.

11. The input device according to claim 10, wherein
the touch switch is disposed closer to the chair than the touch pad.

12. An input device provided for a table including a placement surface on which an object can be placed, the input device comprising:
a sensor that includes a touch sensor of a capacitive type for receiving a touch input on the placement surface;

a controller that determines, based on a detection result from the sensor, whether to enable or disable the touch input received by the touch sensor;

an actuator that vibrates the table, wherein the sensor includes a microphone, and the controller determines whether a feature value related to sound produced by vibrating the table using the actuator and detected by the microphone satisfies a predetermined condition, and determines to disable the touch input when the predetermined condition is satisfied.

13. The input device according to claim 12, wherein the controller determines whether a difference between a reference sound pressure and a sound pressure of sound produced by driving the actuator and detected by the microphone is greater than or equal to a predetermined sound pressure, and determines to disable the touch input when the difference is greater than or equal to the predetermined sound pressure.

14. An input device provided for a table including a placement surface on which an object can be placed, the input device comprising:

a sensor that includes a touch sensor of a capacitive type for receiving a touch input on the placement surface;

a controller that determines, based on a detection result from the sensor, whether to enable or disable the touch input received by the touch sensor, wherein the sensor includes a detector that detects whether the table is accommodated in an accommodation portion, and upon detecting that the table is accommodated in the accommodation portion based on a detection result from the detector, the controller determines to disable the touch input received by the touch sensor.

* * * * *